United States Patent
Taggart et al.

(10) Patent No.: US 7,302,756 B2
(45) Date of Patent: Dec. 4, 2007

(54) BOND FINGER ON VIA SUBSTRATE, PROCESS OF MAKING SAME, PACKAGE MADE THEREBY, AND METHOD OF ASSEMBLING SAME

(75) Inventors: Brian Taggart, Phoenix, AZ (US); Ronald L. Spreitzer, Phoenix, AZ (US); Robert Nickerson, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 486 days.

(21) Appl. No.: 10/612,281

(22) Filed: Jun. 30, 2003

(65) Prior Publication Data
US 2004/0262039 A1    Dec. 30, 2004

(51) Int. Cl.
*H01K 3/10* (2006.01)
(52) U.S. Cl. .............................. 29/850; 29/847; 29/852
(58) Field of Classification Search ........ 174/260–266; 361/792–795; 29/846, 847, 850, 852, 853
See application file for complete search history.

(56) References Cited

U.S. PATENT DOCUMENTS

| | | | |
|---|---|---|---|
| 5,936,844 A * | 8/1999 | Walton | 361/760 |
| 6,084,295 A * | 7/2000 | Horiuchi et al. | 257/690 |
| 6,252,178 B1 * | 6/2001 | Hashemi | 174/260 |
| 6,365,433 B1 * | 4/2002 | Hyoudo et al. | 438/106 |
| 6,489,682 B1 * | 12/2002 | Yeh et al. | 257/738 |
| 6,784,376 B1 * | 8/2004 | Huemoeller et al. | 174/262 |
| 6,812,580 B1 * | 11/2004 | Wenzel et al. | 257/784 |
| 2003/0147227 A1 * | 8/2003 | Egitto et al. | 361/795 |
| 2004/0004278 A1 * | 1/2004 | Cheng et al. | 257/690 |
| 2004/0124545 A1 * | 7/2004 | Wang | 257/784 |

* cited by examiner

*Primary Examiner*—Jeremy C Norris
(74) *Attorney, Agent, or Firm*—Schwegman, Lundberg & Woessner, P.A.

(57) ABSTRACT

A wire-bonding substrate includes a first wire-bond pad and a first via that is disposed directly below the first wire-bond pad in the in the wire-bonding substrate. A package includes a die that is coupled to the first wire-bonding pad. The package can include a larger substrate that is coupled to the wire-bonding substrate through an electrical connection such as a solder ball. A process of forming the wire-bonding substrate includes via formation to stop on the wire-bond pad. A method of assembling a microelectronic package includes coupling the die to the wire-bond pad. A computing system includes the wire-bonding substrate.

10 Claims, 9 Drawing Sheets

BOND FINGER ON VIA SUBSTRATE, PROCESS OF MAKING SAME, PACKAGE MADE THEREBY, AND METHOD OF ASSEMBLING SAME

TECHNICAL FIELD

Disclosed embodiments relate to a wire-bond technology for a substrate. More particularly, disclosed embodiments relate to a bond finger that is aligned with a via in the substrate.

BACKGROUND INFORMATION

A wire-bonding package usually requires significant routing of traces within a printed circuit board (PCB). Where the wire bond attaches to the PCB, a bond finger usually leads under a protective film to a location remote from the wire bond, where it can pass into and through the PCB for further electrical communication. The advent of wireless technologies has led to a push to miniaturize packaged integrated circuits such that conventional wire bonding has become a hindrance with the push to miniaturize. Additionally, various traces on the surface of the PCB that are routed to locations remote from the wire bond can result in significant cross-talk that diminishes the performance of the packaged integrated circuit.

BRIEF DESCRIPTION OF THE DRAWINGS

In order to understand the manner in which embodiments are obtained, a more particular description of various embodiments briefly described above are rendered by reference to the appended drawings. These drawings depict only typical embodiments that are not necessarily drawn to scale and are not therefore to be considered to be limiting of its scope. Some embodiments will be described and explained with additional specificity and detail through the use of the accompanying drawings in which.

DETAILED DESCRIPTION

The following description includes terms, such as upper, lower, first, second, etc. that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A board is typically a resin-impregnated fiberglass structure that acts as a mounting substrate for the die. A die is usually singulated from a wafer, and wafers may be made of semiconducting, non-semiconducting, or combinations of semiconducting and non-semiconducting materials.

Reference is made to the drawings wherein like structures are provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1:
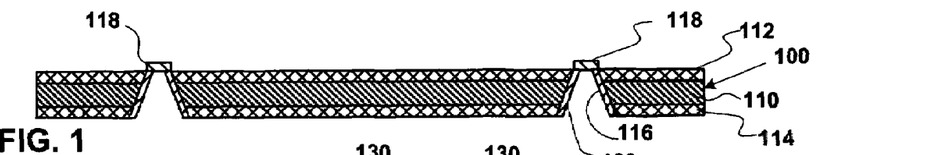
FIG. 1 is a side cross-section of a mounting substrate according to an embodiment.

FIG. 1 is a side cross-section of a mounting substrate 100 according to an embodiment. The mounting substrate 100 includes a substrate core 110, an upper protective layer 112, and a lower protective layer 114. In one embodiment, the upper protective layer 112 is referred to as a first surface, and the lower protective layer 114 is referred to as a second surface. A via 116 is depicted penetrating the substrate core 110, the upper protective layer 112, and the lower protective layer 114. A wire-bond pad 118 is depicted directly above the via 116. In one embodiment, the wire-bond pad 118 is formed by patterning and etching. In one embodiment, the wire-bond pad 118 is formed by patterning a mask and plating. Accordingly, no traces exist on or a the upper surface of the substrate core, and only the bond finger 118 is present.

The wire-bond pad 118 is depicted as a raised structure above the upper protective layer 112. In one embodiment, the wire-bond pad 118 is a bond finger (hereinafter "bond finger 118") that is at least flush with the upper protective layer 112. In one embodiment, a via liner 120 is a metallic or otherwise electrically conductive material that provides an electrical path through the mounting substrate 100.

Formation of the via 116 can be accomplished by various process flows and may have different shapes. In one embodiment, the bond finger 118 is first formed, and the via 116 is formed by laser drilling through the lower protective layer 114, the substrate core 110, and finally through the upper protective layer 112 to stop on the bond finger 118. In other words, forming the via is done by laser drilling that forming proceeds from the second surface 114 toward the first surface 112. In another embodiment, laser drilling is done by drilling at a site that is later occupied by a bond finger 118. Accordingly, the laser drilling is done first, and the placement of the bond finger 118 is done subsequently. In an embodiment, the shape of the via 116 is characteristic of a laser drilling process.

Figure 2:
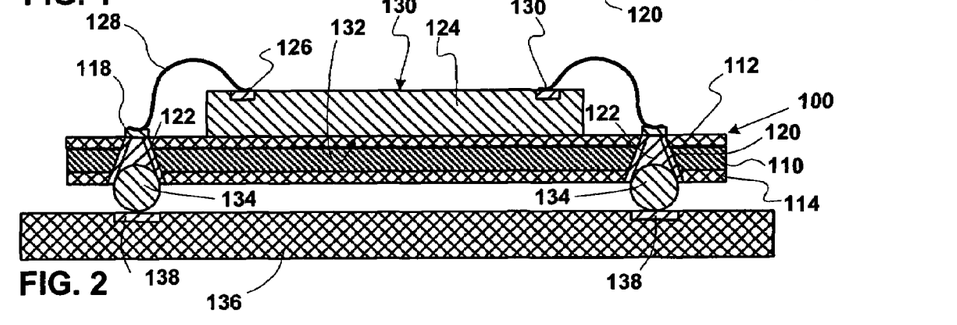
FIG. 2 is a side cross-section of the mounting substrate in FIG. 1 after assembly with a die to form a package, according to an embodiment.

FIG. 2 is a side cross-section of the mounting substrate 100 in FIG. 1 after assembly with a die to form a package, according to an embodiment. In one embodiment, the via 116 is filled with an interconnect 122. In one embodiment, the via 116 is not filled, as depicted in FIG. 1, and the electrical path relies substantially upon the via liner 120. In one embodiment, the via liner 120 is formed under chemical deposition.

A die 124 is depicted mounted upon the mounting substrate 100 at the upper protective layer 112. The die 124 includes an active surface 130 and a backside surface 132. Electrical coupling of the die 124 to the via 116 is done between a die bond pad 126, a bond wire 128, and the bond finger 118. The die bond pad 126 is disposed upon the active surface 130 of the die 124. Although not depicted, the die 124 is adhered to the mounting substrate 100 by a material such as an organic thermal adhesive or the like. The adhesive is disposed between the backside surface 132 of the die 124 and the upper protective layer 112.

FIG. 2 also depicts electrical coupling of the die 124 to a larger substrate. The die 124 is coupled to a bump 134 that in this embodiment, is at least partially disposed in the via 116. The bump 134 can be any electrical connection such as a solder ball, a pin from a pin-grid array, or others. According to this embodiment, the vertical profile of the entire package is lower due to the bump 134 being at least partially embedded in the mounting substrate 100. The larger substrate 136 can be a motherboard, a mezzanine board, an expansion card, or others. In one embodiment, the larger substrate 136 is a penultimate casing for a wireless handheld such as a wireless telephone.

Figure 3:
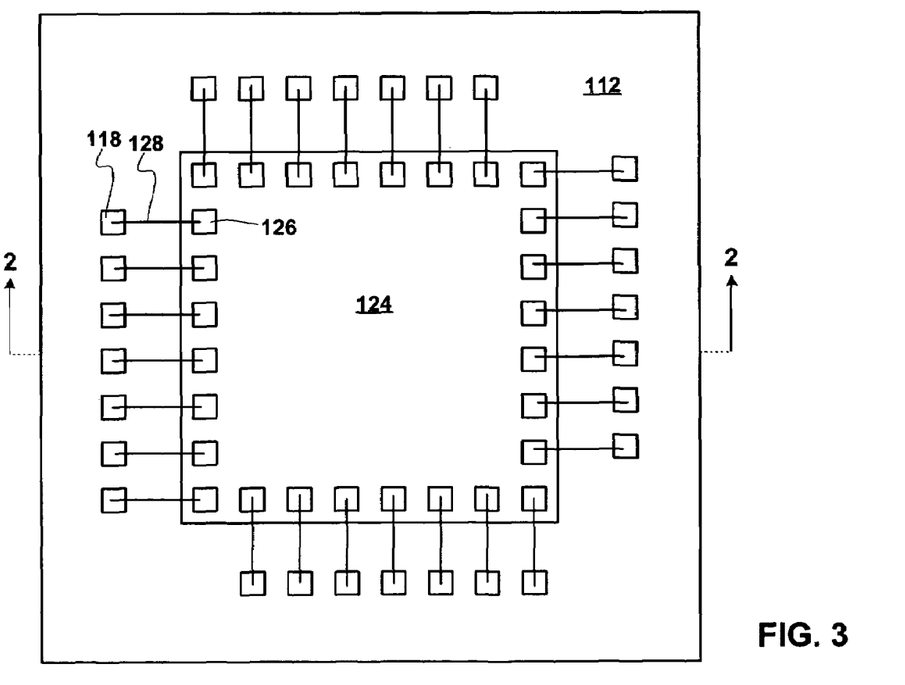
FIG. 3 is a top plan of a package similar to the package depicted in FIG. 2 according to an embodiment.

FIG. 3 is a top plan of a package similar to the package depicted in FIG. 2 according to an embodiment. The view of FIG. 2 can be taken along the line 2-2. The die 124 is depicted mounted upon the upper protective layer 112. The die bond pad 126 is coupled to the bond finger 118 through the bond wire 128. In this embodiment, the plurality of bond fingers 118 is depicted as substantially the same size and pitch as the plurality of die bond pads 126.

Figure 4:
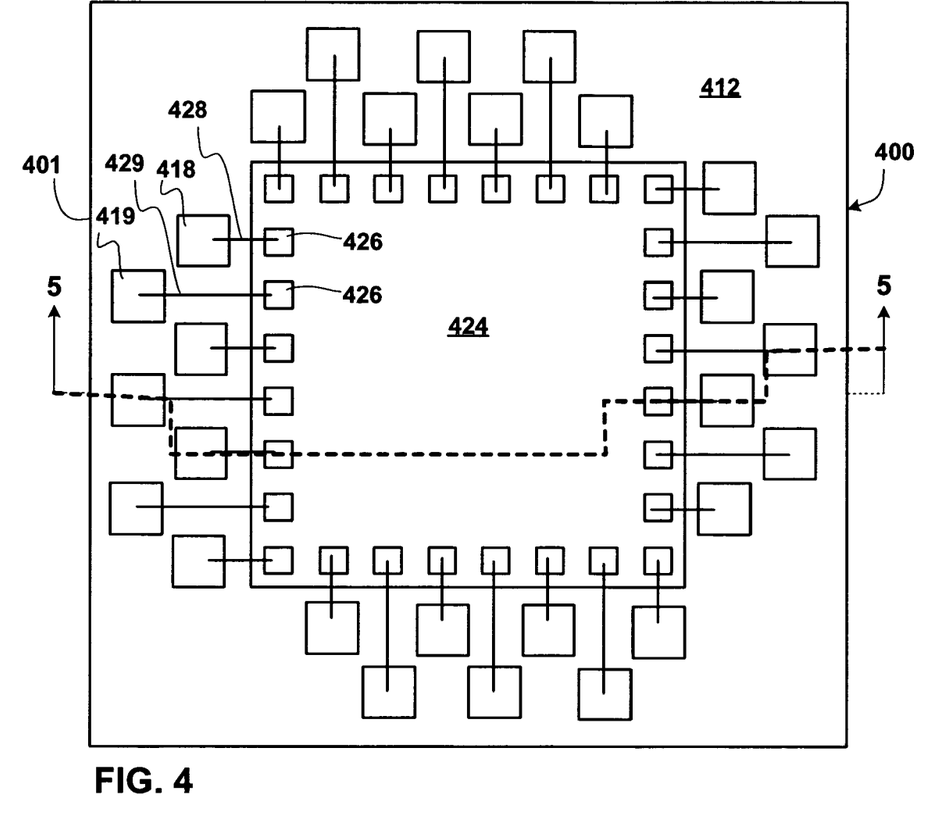
FIG. 4 is a top plan of a package according to an embodiment.

FIG. 4 is a top plan of a package according to an embodiment. A die 424 is depicted mounted upon an upper protective layer 412 of a mounting substrate 400. A plurality of first bond fingers 418 is arrayed substantially parallel to an edge 401 of the mounting substrate 400. A plurality of second bond fingers 419 is also arrayed substantially parallel to the edge 401 of the mounting substrate 400. The plurality of second bond fingers 419, however, is arrayed at a distance from the edge 401 that is less than the distance of the plurality of first bond fingers 418. In other words, a given first bond finger 418 and a given second bond finger 419 are arrayed in a staggered configuration with respect to the edge 401 of the mounting substrate 400. In this embodiment, the staggered configuration allows a larger bump (not pictured) to couple the die 424 to the outside world, without shorting into a contiguous bump.

Figure 5:
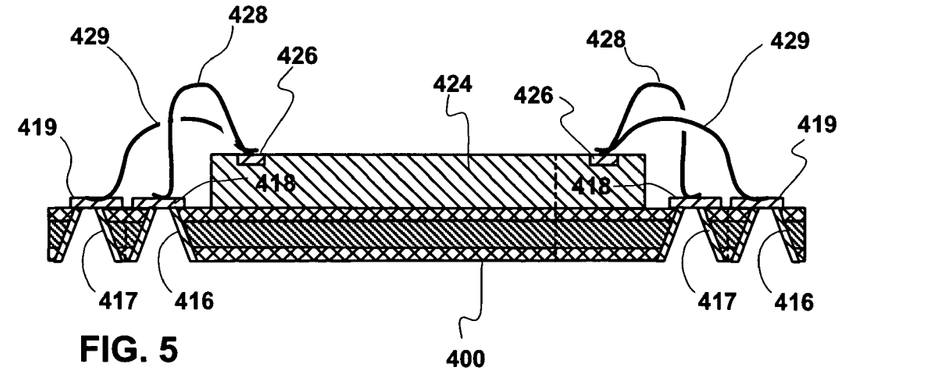
FIG. 5 is a side cut-away of the package depicted in FIG. 4 according to an embodiment.

FIG. 5 is a side cut-away of the package depicted in FIG. 4 according to an embodiment. The substrate 400 includes a first via 416 and a second via 417. As taken along the line 5-5 in FIG. 4, the substrate 400 is cut away to reveal the staggered configuration of the first via 416 and the second via 417. The first via 416 is disposed directly below the first bond finger 418. Similarly, the second via 417 is disposed directly below the second bond finger 419. In one embodiment (not pictured), only one of the first via 416 and the second via 417 is disposed directly below their respective bond fingers.

In one embodiment, electronic tuning of the package is done by making the first bond wire 428 the same length, or the like, as the second bond wire 429. Although the first bond finger 418 is closer to its respective die bond pad 426 than the second bond finger 419 to its respective die bond pad (not pictured), the lengths of the respective bond wires are tuned to achieve a similar signal delay during operation of the die 424.

Figure 6:
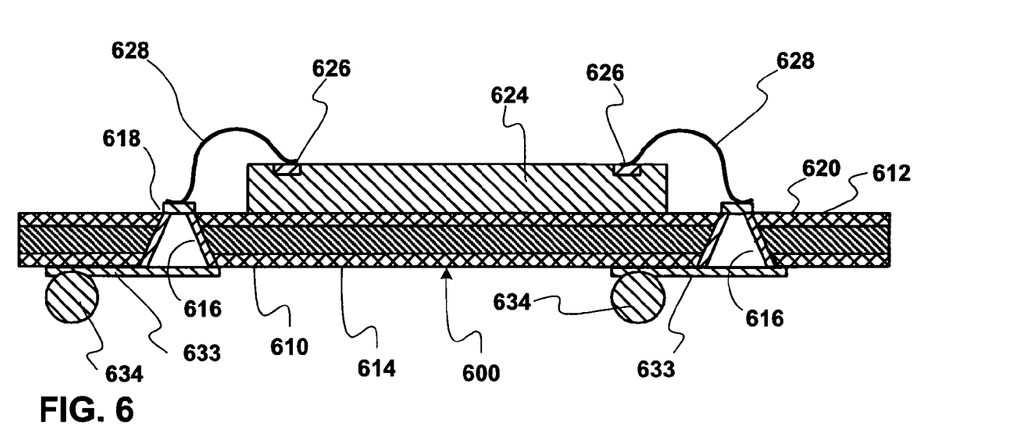
FIG. 6 is a side cross-section of a package according to an embodiment.

FIG. 6 is a side cross-section of a package according to an embodiment. In one embodiment, it is not always the case that a given bump can be or is desired to be lodged in the via with which it communicates. FIG. 6 depicts a mounting substrate 600 that includes a substrate core 610, an upper protective layer 612, and a lower protective layer 614. A via 616 is depicted penetrating the substrate core 610, the upper protective layer 612, and the lower protective layer 614. A wire-bond pad 618 or bond finger 618 is depicted directly above the via 616. The bond finger 618 is depicted as a raised structure above the upper protective layer 612. In one embodiment, the bond finger 618 is at least flush with the upper protective layer 612. In one embodiment, a via liner 620 is a metallic or otherwise electrically conductive material that provides an electrical path through the mounting substrate 600.

FIG. 6 also depicts a die 624 disposed upon the upper protective layer 612. Additionally, a bump 634 is disposed below the mounting substrate 600 that is not directly below the via 616. The bump 634 is coupled to the via 616 by a trace 633. Consequently, the die 624 communicates to the bump 634 commencing with a die bond pad 626, the bond wire 628, the bond finger 618, and the trace 633.

In one embodiment, the via 616 is filled with an interconnect (not pictured) such as the interconnect 122 depicted in FIG. 2. In one embodiment, the via 616 is not filled, as depicted in FIG. 6, and the electrical path relies substantially upon the via liner 620. Electrical coupling of the die 624 to the via 616 is done between the die bond pad 626, the bond wire 628, and the bond finger 618.

Figure 7:
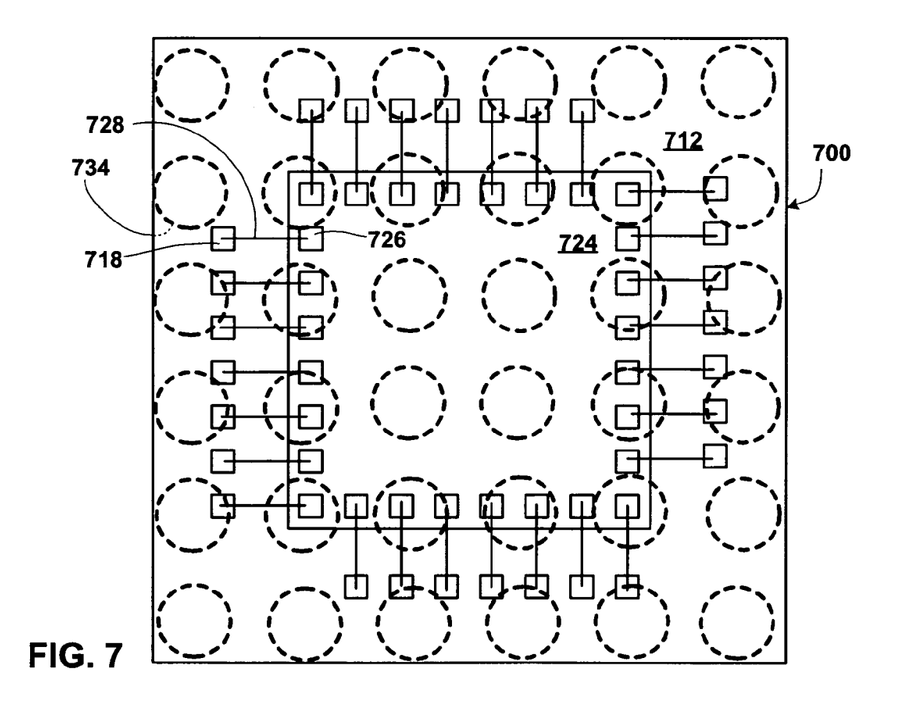
FIG. 7 is a top plan of a package similar to the package depicted in FIG. 6 according to an embodiment.

FIG. 7 is a top plan of a package similar to the package depicted in FIG. 6 according to an embodiment. A die 724 is depicted mounted upon an upper protective layer 712 of a mounting substrate 700. A die bond pad 726 is coupled to a bond finger 718 through a bond wire 728. In this embodiment, the plurality of bond fingers 718 is depicted as substantially the same size and pitch as the plurality of die bond pads 726. The bond fingers 718, however, are not depicted as directly over any given bump 734, which are depicted in phantom lines. Accordingly, a trace (not pictured) such as the trace 633 depicted in FIG. 6 couples the bond finger 718 to a given bump 734. According to this embodiment, a uniform or substantially uniform ball-grid array (BGA) such as the bumps 734 can be achieved, while maintaining the embodiment of having each bond finger directly over a via. In one embodiment, however, at least one bond finger is disposed directly over its respective via, but not all bond fingers in the package are thus disposed.

Figure 8:
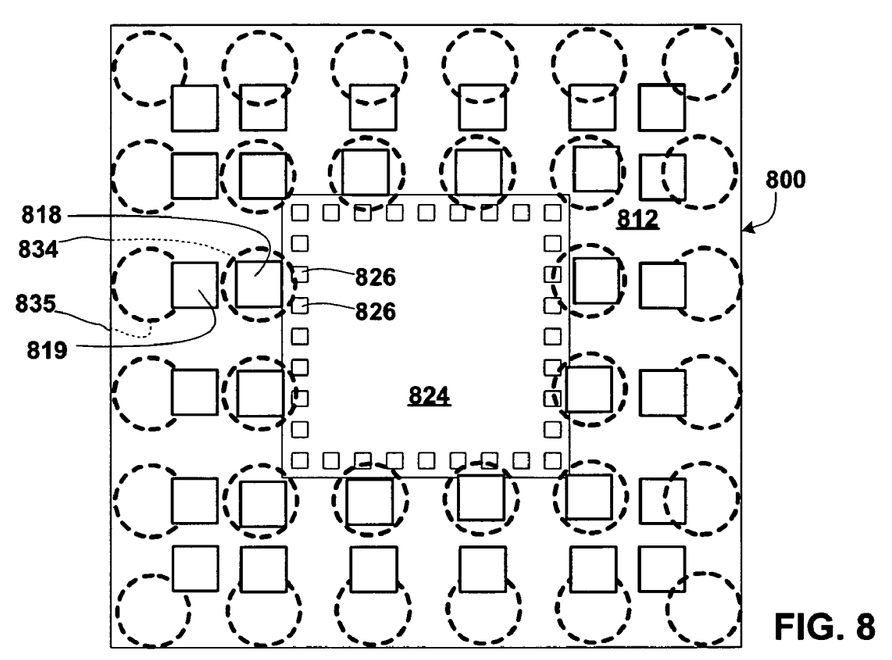
FIG. 8 is a top plan of a package according to an embodiment.

FIG. 8 is a top plan of a package according to an embodiment. In FIG. 8, a mounting substrate 800 includes a first plurality of bond fingers 818 that are proximate a die 824. The die 824 includes, by way of non-limiting example, a plurality of die bond pads 826. Coupling of the die at the bond pads 826 is done by bond wire, but the bond wire is not depicted for clarity of the layout of die bond pads 826 and bond fingers 818 and 819. Tuning of the package can be done according to the embodiment depicted in FIG. 5 by varying the lengths of the bond wires 528 and 529.

The first plurality of bond fingers 818 is coupled in this embodiment through respective vias that are directly below the first plurality of bond fingers 818. The respective vias (not pictured) are likewise coupled to a respective plurality of bumps 834 depicted in phantom lines. The bumps 834 are directly below the vias. In one embodiment, the bumps 834 are at least partially embedded in the vias, similar to the depiction of the bump 134 in the via 116 in FIG. 2.

FIG. 8 also depicts a second plurality of bond fingers 819 that are remote from the die 824 in relation to the first plurality of bond fingers 818. The second plurality of bond fingers 819 are coupled in this embodiment through respective vias (not pictured) that are directly below the second plurality of bond fingers 819. The respective vias are likewise coupled to a respective plurality of bumps 835 (depicted in phantom lines) that in one embodiment are not aligned and directly below the vias, similar to the depiction of the bump 634 near the via 616 in FIG. 6.

According to this embodiment, a uniform-pitch or substantially uniform-pitch ball-grid array (BGA) such as the bumps 834 and 835 can be achieved, while maintaining the embodiment of having each bond finger directly over a respective via. In one embodiment, however, at least one bond finger is disposed directly over its respective via, but not all bond fingers in the package are thus disposed.

Figure 9:
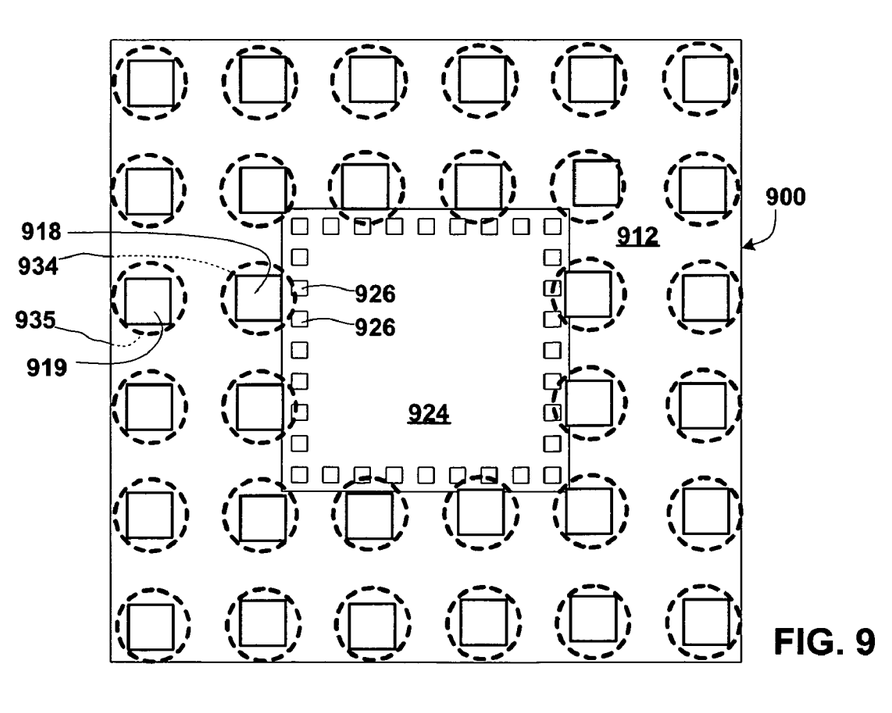
FIG. 9 is a top plan of a package according to an embodiment.

FIG. 9 is a top plan of a package according to an embodiment. In FIG. 9, a mounting substrate 900 includes a first plurality of bond fingers 918 that are proximate a die 924. The die 924 includes by way of non-limiting example, a plurality of die bond pads 926. Coupling of the die 924 at the die bond pads 926 is done by bond wire, but the bond wire is not depicted for clarity of the layout of die bond pads 926 and bond fingers 918 and 919. Tuning of the package can be done according to the embodiment depicted in FIG. 5 by varying the lengths of the bond wires 528 and 529.

The first plurality of bond fingers 918 is coupled in this embodiment through respective vias that are directly below the first plurality of bond fingers 918. The respective vias (not pictured) are likewise coupled to a respective plurality of bumps 934 (depicted in phantom lines) that in this embodiment is directly below its respective via. In one embodiment, the bumps 934 are at least partially embedded in the vias, similar to the depiction of the bump 134 in the via 116 in FIG. 2.

FIG. 9 also depicts a second plurality of bond fingers 919 that are remote from the die 924 in relation to the first plurality of bond fingers 918. The second plurality of bond fingers 919 is coupled in this embodiment through respective vias (not pictured) that are directly below the second plurality of bond fingers 919. The respective vias are likewise coupled to a respective plurality of bumps 935 (depicted in phantom lines) that in this embodiment is aligned directly below the vias, similar to the depiction of the bump 134 in the via 116 in FIG. 2.

According to this embodiment, a uniform-pitch or substantially uniform-pitch ball-grid array BGA such as the bumps 934 and 935 can be achieved, while maintaining the embodiment of having each bond finger directly over a respective via, or at least one of them.

Figure 10:
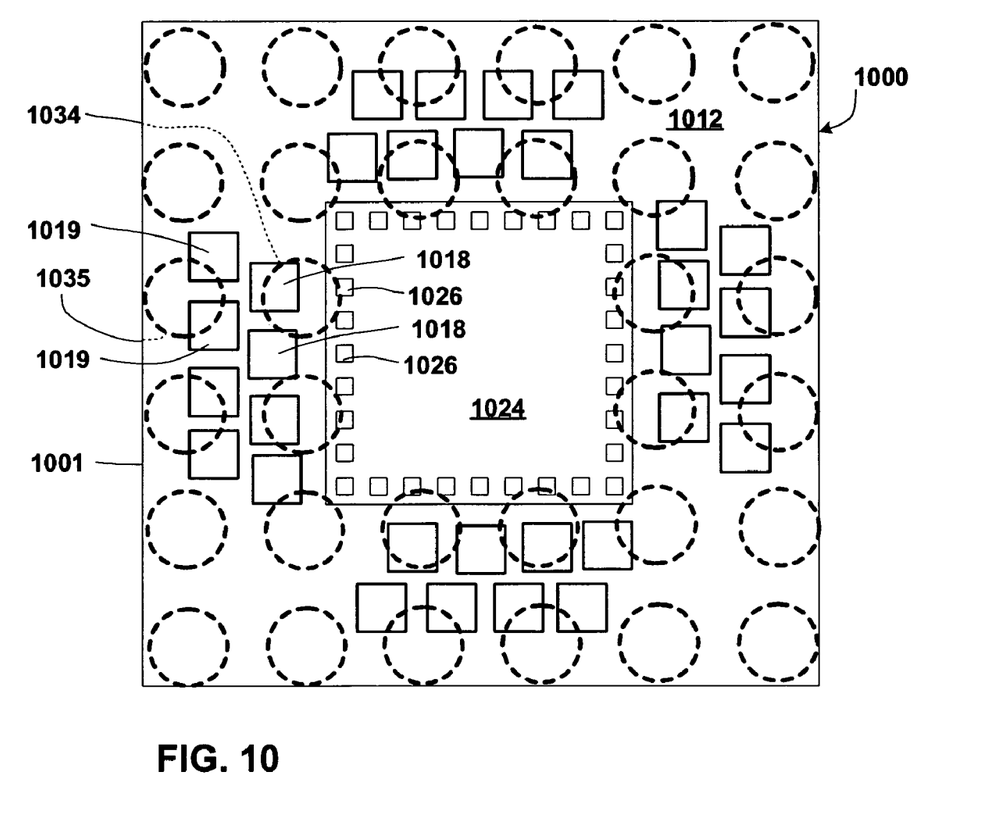
FIG. 10 is a top plan of a package according to an embodiment.

FIG. 10 is a top plan of a package according to an embodiment. A die 1024 is depicted mounted upon an upper protective layer 1012 of a mounting substrate 1000. A plurality of first bond fingers 1018 is arrayed substantially parallel to an edge 1001 of the mounting substrate 1000. A plurality of second bond fingers 1019 is also arrayed substantially parallel to the edge 1001 of the mounting substrate 1000. The plurality of second bond fingers 1019, however, is arrayed at a distance from the edge 1001 that is less than the plurality of first bond fingers 1018. In other words, a given first bond finger 1018 and a given second bond finger 1019 are arrayed in a staggered configuration with respect to the edge 1001 of the mounting substrate 1000. In this embodiment, the staggered configuration allows a larger bond finger to couple the die 1024 to the outside world.

FIG. 10 depicts the plurality of first and second bond fingers 1018 and 1019 as not necessarily directly disposed over any given bump 1034 or 1035, which are depicted in phantom lines. Accordingly, a trace (not pictured) such as the trace 633 depicted in FIG. 6 couples a given bond finger 1018 to a given bump 1034. According to this embodiment, a uniform-pitch or substantially uniform-pitch BGA such as the bumps 1034 and 1035 can be achieved, while maintaining the embodiment of having each bond finger directly over a via. In one embodiment, however, at least one bond finger is disposed directly over its respective via, but not all bond fingers in the package are thus disposed.

In this embodiment, the number of bumps 1034 and 1035 is the same as the number die bond pads (not pictured), and the space below the die 1024 is taken up by some of the bumps 1137.

Figure 11:
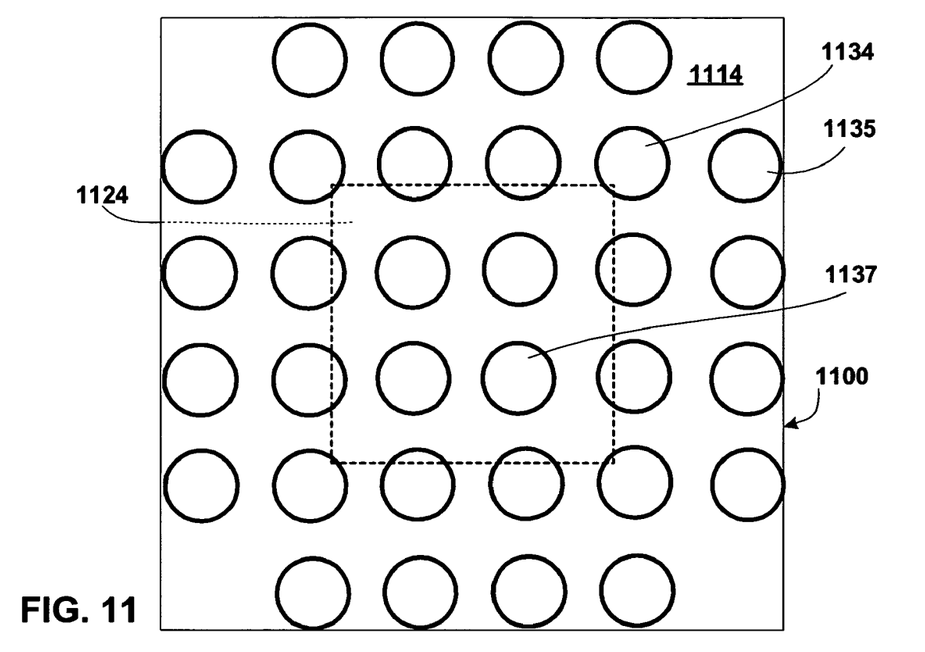
FIG. 11 is a bottom plan of a package according to an embodiment.

FIG. 11 is a bottom plan of a package according to an embodiment. A mounting substrate 1100 is depicted with a lower protective layer 1114. As in the embodiments depicted in this disclosure, a via (not pictured) penetrates the mounting the substrate 1100, and a bond finger (not pictured) is disposed directly above the via. A BGA of bumps 1134, 1135, and 1137 is located at three distinct distances from a die 1124 (depicted in phantom lines). In this embodiment, the number of bumps 1134, 1135, and 1137, is the same as the number die bond pads (not pictured), and the space below the die 1124 is taken up by some of the bumps 1137.

Figure 12:
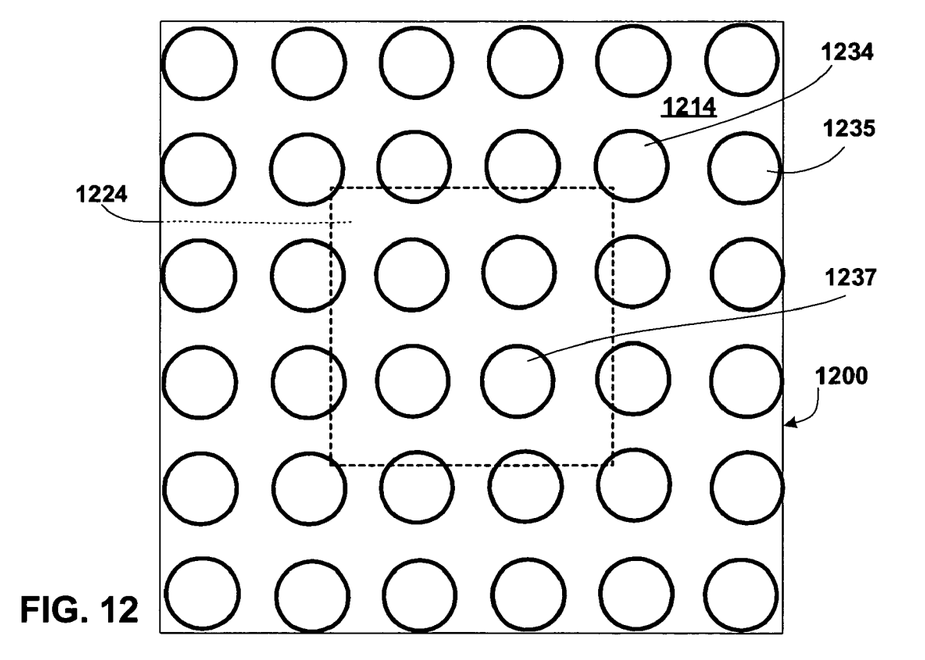
FIG. 12 is a bottom plan of a package according to an embodiment.

FIG. 12 is a bottom plan of a package according to an embodiment. A mounting substrate 1200 is depicted with a lower protective layer 1214. As in the embodiments depicted in this disclosure, a via (not pictured) penetrates the mounting the substrate 1200, and a bond finger (not pictured) is disposed directly above the via. A BGA of bumps 1234, 1235, and 1237 is located at three distinct distances from a die 1224. In this embodiment, the number of bumps 1234, 1235, and 1237 is greater than the number of bumps die bond pads (not pictured) such that some of the bumps can act as dummy bumps to facilitate package integrity.

Figure 13:
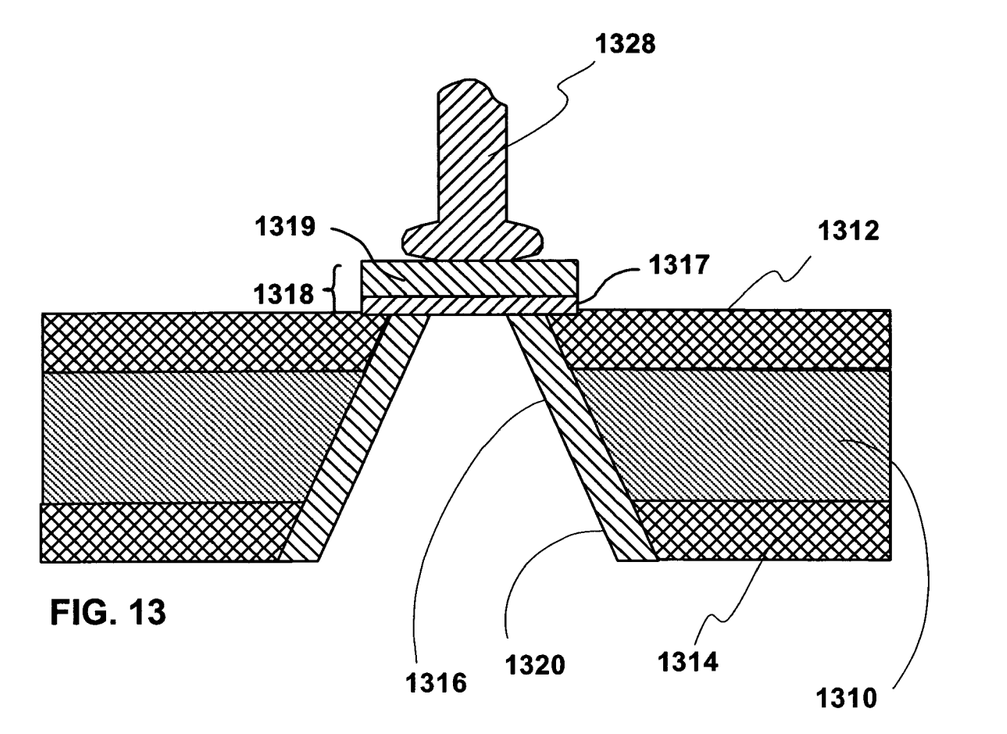
FIG. 13 is a side cross-section detail from a package according to an embodiment.

FIG. 13 is a side cross-section a package according to an embodiment. A substrate core 1310 is laminated with an upper protective layer 1312, and a lower protective layer 1314. A via 1316 is depicted penetrating the substrate core 1310, the upper protective layer 1312, and the lower protective layer 1314. A wire-bond pad 1318 is depicted directly above the via 1316. The wire-bond pad 1318 is depicted as a raised structure above the upper protective layer 1312. In one embodiment, the wire-bond pad 1318 is a bond finger 1318 that is at least flush with the upper protective layer 1312. In one embodiment, a via liner 1320 is a metallic or otherwise electrically conductive material that provides an electrical path through the substrate core 1310.

A bond wire 1328 is depicted as having been bonded to a bond finger 1318. The metal of the bond wire 1328 is selected from aluminum or an aluminum alloy, gold or a gold alloy, silver or a silver alloy, doré, or platinum or a platinum alloy. The bond finger 1318 includes a flash plating layer 1317 and a heavy plating layer 1319. In one embodiment, the heavy plating layer 1319 is a material that resists alloying with bond wire 1328.

One feature of an embodiment is the ability of the heavy plating layer 1319 to bond with bond wire 1328, but not to alloy therewith. In some applications, a bond wire article may be rejected and reworked by pulling or cutting the bond wires and repeating the bond wire process flow.

In one embodiment, the flash plating layer 1317 is a precious metal or precious metal alloy. In one embodiment, the flash plating layer 1317 is formed by a deposition process flow that is electroless plating. In one embodiment, the precious metal for the flash plating layer 1317 includes silver (Ag), gold (Au), platinum (Pt), and combinations thereof. In one embodiment, the flash plating layer 1317 is primarily gold. In one embodiment, the flash plating layer 1317 is primarily silver. In one embodiment, the precious metal for the flash plating layer 1317 includes nickel (Ni), palladium (Pd), platinum (Pt), and combinations thereof. In one embodiment, the flash plating layer 1317 is primarily platinum. In another embodiment, precious metal for the flash plating layer 1317 includes cobalt (Co), rhodium (Rh), iridium (Ir), and combinations thereof. In one embodiment, the flash plating layer 1317 is primarily iridium.

In one embodiment, the heavy plating layer 1319 is formed of identical material to the flash plating layer 1317. In one embodiment, the heavy plating layer 1319 is at least one of a more noble, or a softer (more ductile) metal than the flash plating layer 1317. In one embodiment, the heavy plating layer 1319 is selected from gold, doré, platinum, and other compositions that are more noble and more ductile than the flash plating layer 1317.

One embodiment includes a heavy plating layer 1319 that resists alloying with the bond wire 1328 during ordinary wire-bonding process flows. In one embodiment, an aluminum or aluminum alloy bond wire 1328 is attached to the heavy plating layer 1319. In one embodiment, a gold or gold alloy bond wire 1328 is attached to the heavy plating layer 1319. In one embodiment, a silver or silver alloy bond wire 1328 is attached to the heavy plating layer 1319. In one embodiment, a doré bond wire 1328 is attached to the heavy plating layer 1319. In one embodiment, a platinum or platinum alloy bond wire 1328 is attached to the heavy plating layer 1319.

In one embodiment, the formation of the heavy plating layer 1319 is carried out according to vapor deposition techniques, or by liquid plating techniques as set forth herein. In one embodiment, formation of the heavy plating layer 1319 is carried out by electroless plating by using a gold-cyanide electroless plating solution, and the Merrill-Crowe technique. In this embodiment, an atom-thick layer of zinc (Zn, not pictured) is pre-plated onto the flash plating layer 1317 by an electroless process that does not substantially cover the upper protective layer 1312, and the gold-cyanide solution is contacted with the zinc which causes the reduction of the gold out of the gold-cyanide complex.

In another electroless plating embodiment, a gold halide solution is Eh-pH manipulated according to the technique pioneered by Pourbaix. In one embodiment, the flash plating layer 1317 acts as an autocatalytic surface to assist the selective precipitation of the heavy plating layer 1319.

In another embodiment, the heavy plating layer 1319 is formed by a chemical deposition process that is carried out during which a organometallic gold vapor or a gold halide vapor that is metered, blanket deposited, and patterned with an etch. In another embodiment, the heavy plating layer 1319 is formed by a chemical deposition process that is carried out in which a gold target is impinged to form a blanket layer of gold that is subsequently patterned into the heavy plating layer 1319.

Figure 14:
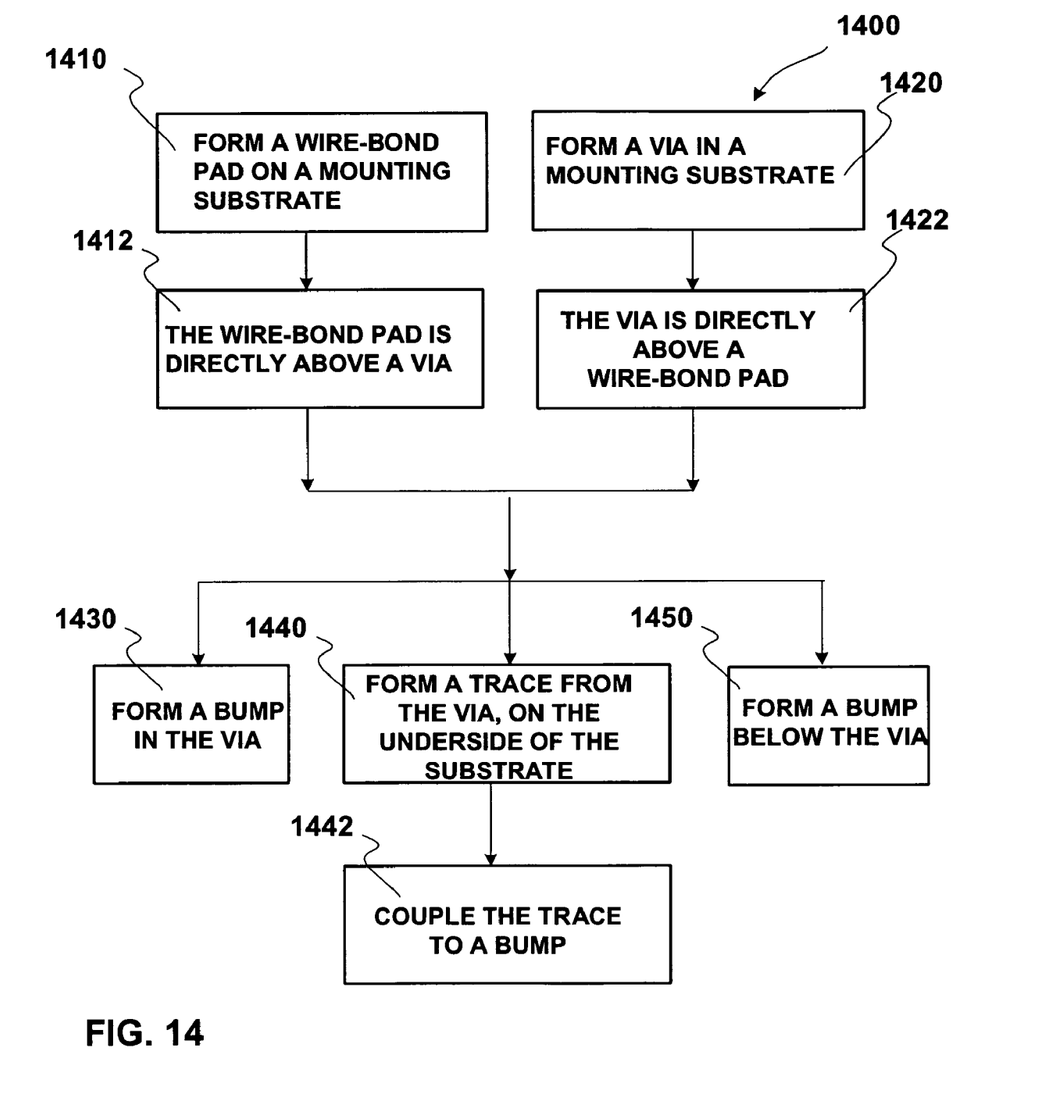
FIG. 14 is a process flow diagram according to various embodiments.

FIG. 14 is a process flow diagram according to various embodiments. The process 1400 includes forming a wire-bond pad directly above a via.

At 1410, the process can commence by forming a wire-bond pad on a mounting substrate. At 1412, the wire-bond pad was formed over an existing via. In one embodiment, the process is completed at 1410. In a method embodiment, the path in the process flow is taken until 1410. At various stages of this method, a die can be coupled to the via and/or the bump.

At 1420, the process can commence by forming a via in a mounting substrate. Formation of the via can be done by any acceptable method such as laser drilling or the like. At 1422, the via is formed over an existing wire-bond pad. In one embodiment, laser drilling is done until the via stops on the wire-bond pad. In one embodiment, the process is completed at 1422. In a method embodiment, the path in the process flow is taken until 1422. At various stages of this method, a die can be coupled to the via and/or the bump.

At 1430, the process continues by forming a bump in the via. By way of non-limiting example, the structure depicted in FIG. 2 illustrates a bump 134 disposed in a via 116. In one embodiment, the process is completed at 1430. In a method embodiment, the path in the process flow is taken until 1430. At various stages of this method, a die can be coupled to the via and/or the bump.

At 1440, the process flow includes forming a trace from the via, on the underside of the substrate. According to a non-limiting example, FIG. 6 illustrates a trace 633 that is formed upon the lower protective layer 614, which is the underside of the substrate. At 1442, the process flow continues by coupling the trace to a bump. In one embodiment, the process is completed at 1442. In a method embodiment, the path in the process flow is taken until 1442. At various stages of this method, a die can be coupled to the via and/or the bump.

At 1450 the process flow includes forming a bump below the via. In this embodiment, the bump does not necessarily need to be at a location that is directly below the via. In other words, the bump can be directly below the via, it can be slightly offset from the center of the via as illustrated in some of the Figures, or it can be coupled with a trace. In one embodiment, the process is completed at 1450. In a method embodiment, the path in the process flow is taken until 1450. At various stages of this method, a die can be coupled to the via and/or the bump.

Figure 15:
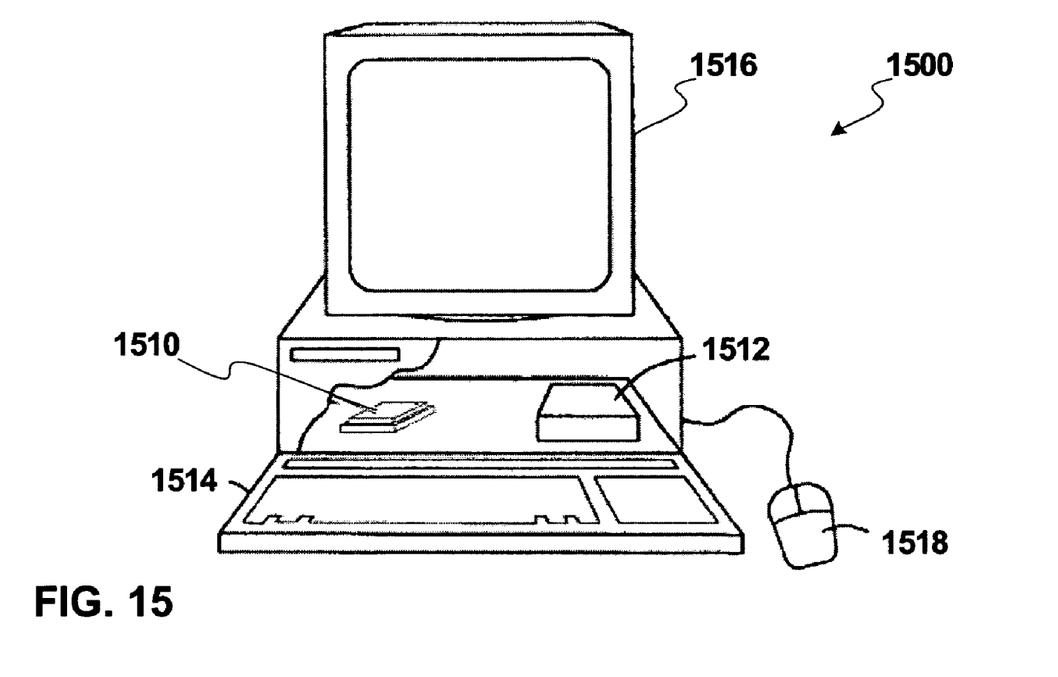
FIG. 15 is a depiction of a computing system according to an embodiment.

FIG. 15 is a depiction of a computing system according to an embodiment. One or more of the foregoing embodiments of a via with a bond finger directly above the via may be utilized in a computing system, such as a computing system 1500 of FIG. 15. The computing system 1500 includes at least one processor (not pictured), which is enclosed in a microelectronic device package 1510, a data storage system 1512, at least one input device such as keyboard 1514, and at least one output device such as monitor 1516, for example. The computing system 1500 includes a processor that processes data signals, and may include, for example, a microprocessor, available from Intel Corporation. In addition to the keyboard 1514, the computing system 1500 can include another user input device such as a mouse 1518, for example.

For purposes of this disclosure, a computing system 1500 embodying components in accordance with the claimed subject matter may include any system that utilizes a microelectronic device package, which may include, for example, a data storage device such as dynamic random access memory, polymer memory, flash memory, and phase-change memory. The microelectronic device package can also include a die that contains a digital signal processor (DSP), a micro controller, an application specific integrated circuit (ASIC), or a microprocessor.

Embodiments set forth in this disclosure can be applied to devices and apparatuses other than a traditional computer. For example, a die can be packaged with an embodiment of the via with a bond finger directly above the via, and placed in a portable device such as a wireless communicator or a hand-held device such as a personal data assistant and the like. Another example is a die that can be packaged with an embodiment of the via with a bond finger directly above the via and placed in a vehicle such as an automobile, a locomotive, a watercraft, an aircraft, or a spacecraft.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   forming a first via in a wire-bonding mounting substrate, wherein the wire-bonding mounting substrate includes an upper protective layer and a lower protective layer, and wherein forming proceeds from the lower protective layer toward the upper protective layer; and
   patterning a first wire-bond pad symmetrically and directly over the first via, wherein forming ceases upon contact with the first wire-bond pad.

2. The process of claim 1, further including:
   forming a via liner in the first via.

3. The process of claim 1, further including:
   filling the first via with an interconnect.

4. The process of claim 1, wherein forming the first via precedes patterning the first wire-bond pad.

5. The process of claim 1, further including:
   filling the first via with an interconnect;
   coupling the first via to a first bump.

6. The process of claim 1, further including:
   coupling the first wire-bond pad to a first bump.

7. A method comprising:
   forming a first via in a wire-bonding mounting substrate, wherein the wire-bonding mounting substrate includes an upper protective layer and a lower protective layer, and wherein forming proceeds from the lower protective layer toward the upper protective layer;
   patterning a first wire-bond pad directly over the first via, wherein forming ceases upon contact with the first wire-bond pad; and
   coupling a die to the first wire-bond pad.

8. The method of claim 7, further including:
   forming a second via in the wire-bonding mounting substrate;
   patterning a second wire-bond pad directly over the second via; and
   coupling the die to the second wire-bond pad.

9. The method of claim 7, further including:
   filling the first via with an interconnect.

10. The method of claim 7, further including:
    filling the first via with an interconnect; and
    coupling the first via to a first bump.

* * * * *

UNITED STATES PATENT AND TRADEMARK OFFICE
CERTIFICATE OF CORRECTION

PATENT NO. : 7,302,756 B2
APPLICATION NO. : 10/612281
DATED : December 4, 2007
INVENTOR(S) : Taggart et al.

It is certified that error appears in the above-identified patent and that said Letters Patent is hereby corrected as shown below:

On the title page, in field (57), under "Abstract", in column 2, line 3, after "pad in the" delete "in the".

Signed and Sealed this

First Day of April, 2008

JON W. DUDAS
*Director of the United States Patent and Trademark Office*